(12) United States Patent
Babson et al.

(10) Patent No.: US 6,400,166 B2
(45) Date of Patent: *Jun. 4, 2002

(54) MICRO PROBE AND METHOD OF FABRICATING SAME

(75) Inventors: Gordon M. Babson, Williston; Anthony M. Palagonia, Underhill, both of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/292,721

(22) Filed: Apr. 15, 1999

(51) Int. Cl.⁷ .............................................. G01R 31/02
(52) U.S. Cl. ..................... 324/754; 324/158.1
(58) Field of Search ............. 438/53, 482; 216/2; 156/629, 643, 647; 250/306; 73/105; 324/754, 755, 762, 158.1; 439/66, 482, 700

(56) References Cited

U.S. PATENT DOCUMENTS

| | | | |
|---|---|---|---|
| 5,051,379 A | * 9/1991 | Bayer et al. ................ 437/225 |
| 5,066,358 A | * 11/1991 | Quate et al. ................ 156/647 |
| 5,221,415 A | * 6/1993 | Albrecht et al. ............ 156/629 |
| 5,302,239 A | * 4/1994 | Roe et al. ................... 156/643 |
| 5,382,795 A | 1/1995 | Bayer et al. |
| 5,393,375 A | 2/1995 | MacDonald et al. |
| 5,393,647 A | 2/1995 | Neukermans et al. |
| 5,425,649 A | * 6/1995 | Reymond .................... 439/189 |
| 5,449,903 A | 9/1995 | Arney et al. |
| 5,475,318 A | * 12/1995 | Marcus et al. .............. 324/762 |
| 5,594,166 A | * 1/1997 | Itoh et al. .................... 73/105 |
| 5,606,162 A | * 2/1997 | Buser et al. ................. 250/306 |
| 5,658,710 A | 8/1997 | Neukermans |
| 5,719,073 A | 2/1998 | Shaw et al. |
| 5,725,729 A | 3/1998 | Greiff |
| 5,753,912 A | * 5/1998 | Matsuyama ................. 250/306 |
| 5,756,370 A | 5/1998 | Farnworth et al. |
| 5,866,805 A | * 2/1999 | Han et al. .................... 73/105 |
| 5,908,981 A | * 6/1999 | Atalar et al. ................. 73/105 |
| 5,994,160 A | * 11/1999 | Niedermann et al. ......... 438/53 |
| 6,066,265 A | * 5/2000 | Galvin et al. ................. 216/2 |

* cited by examiner

Primary Examiner—Michael J. Sherry
Assistant Examiner—Jimmy Nguyen
(74) Attorney, Agent, or Firm—Robert A. Walsh

(57) ABSTRACT

A monolithic probe having an integral fine probe point, pressure spring, conductive line, and connector for contacting semiconductor devices to be tested and a method of construction of said probe is described. Integration of a serpentine spring into the probe body reduces breakage and improves contact reliability. Standard, coaxial, triaxial, and Kelvin probes are described. The methods of construction described utilize standard semiconductor processes. The probes may be fabricated to very small dimensions.

22 Claims, 7 Drawing Sheets

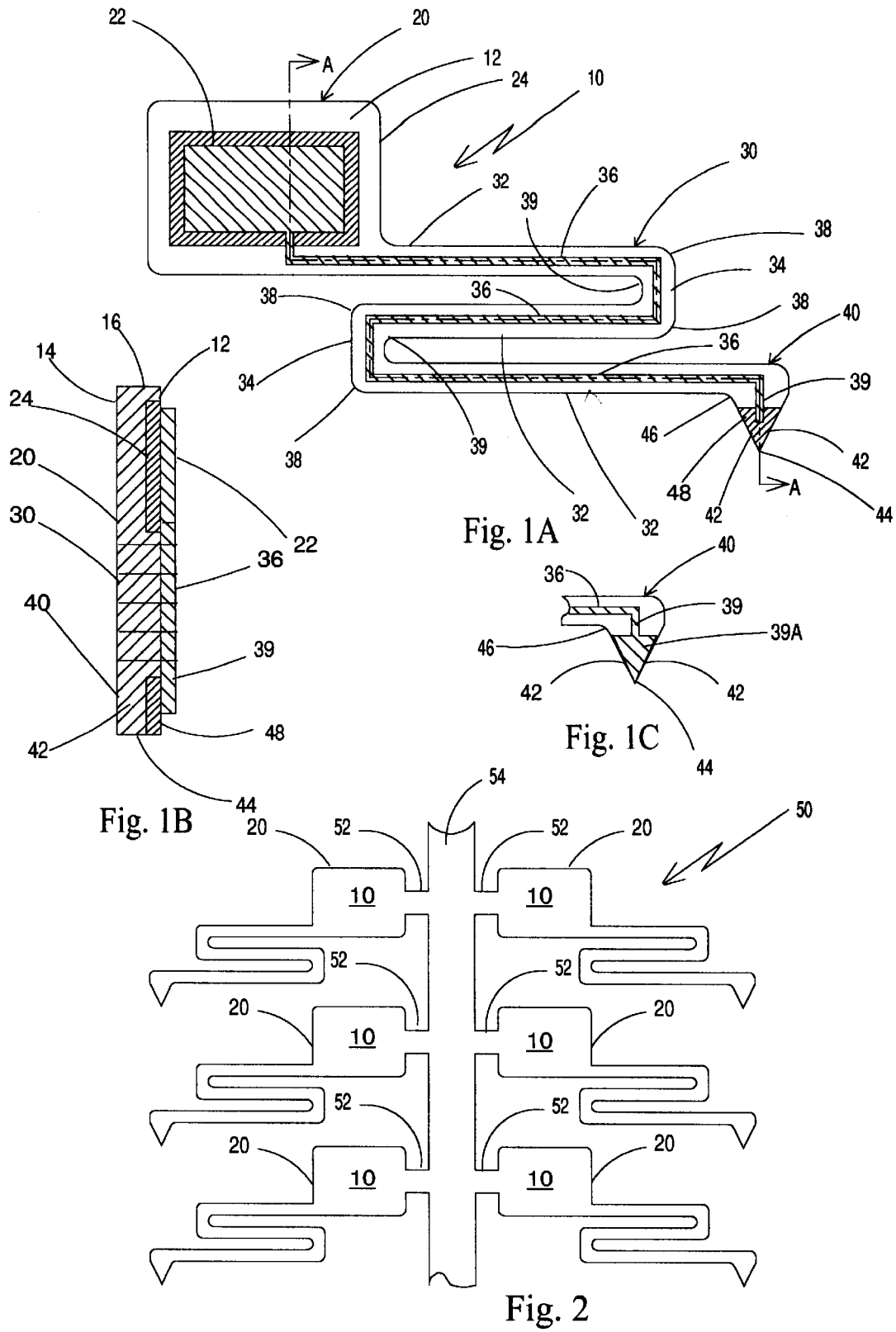

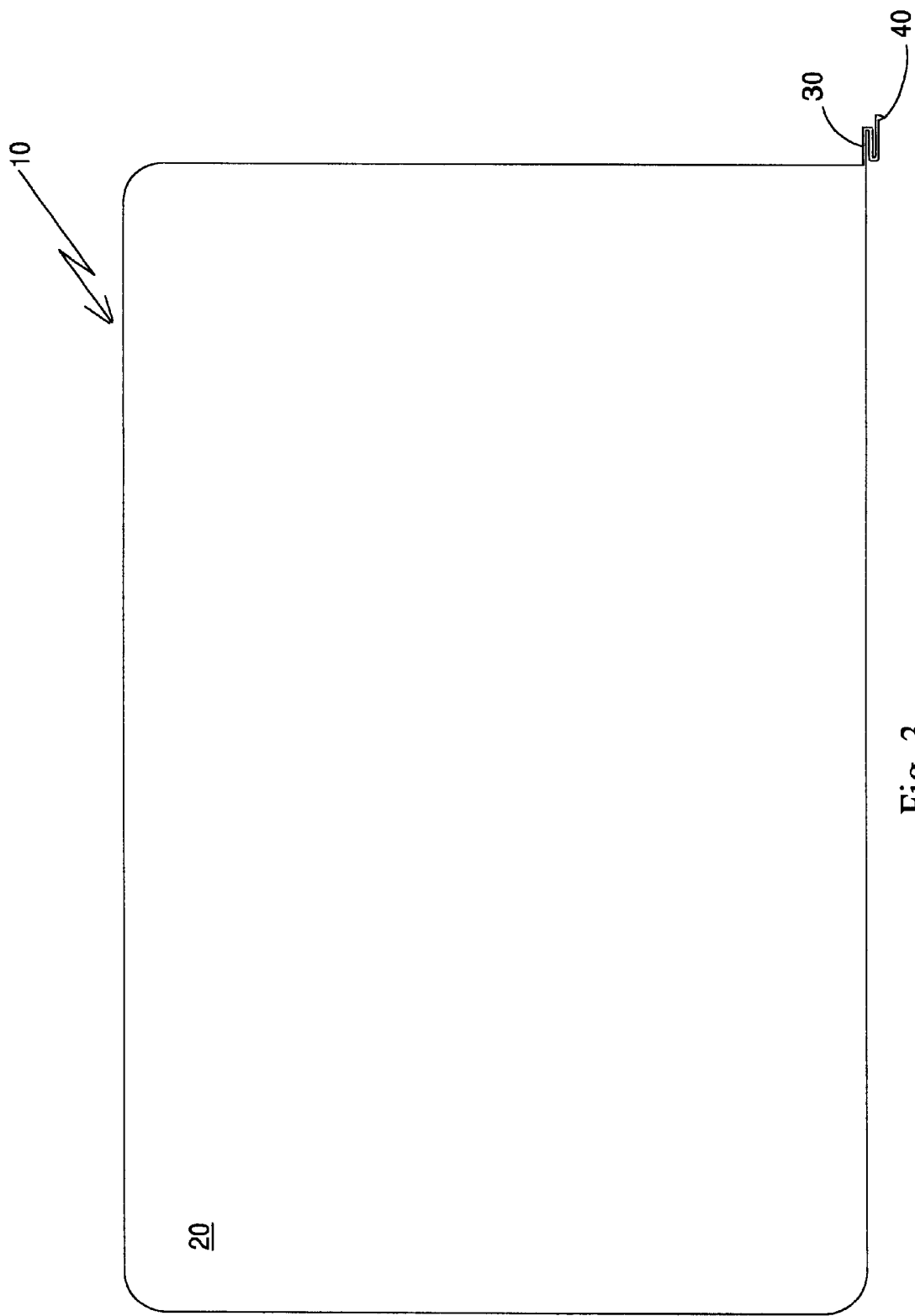

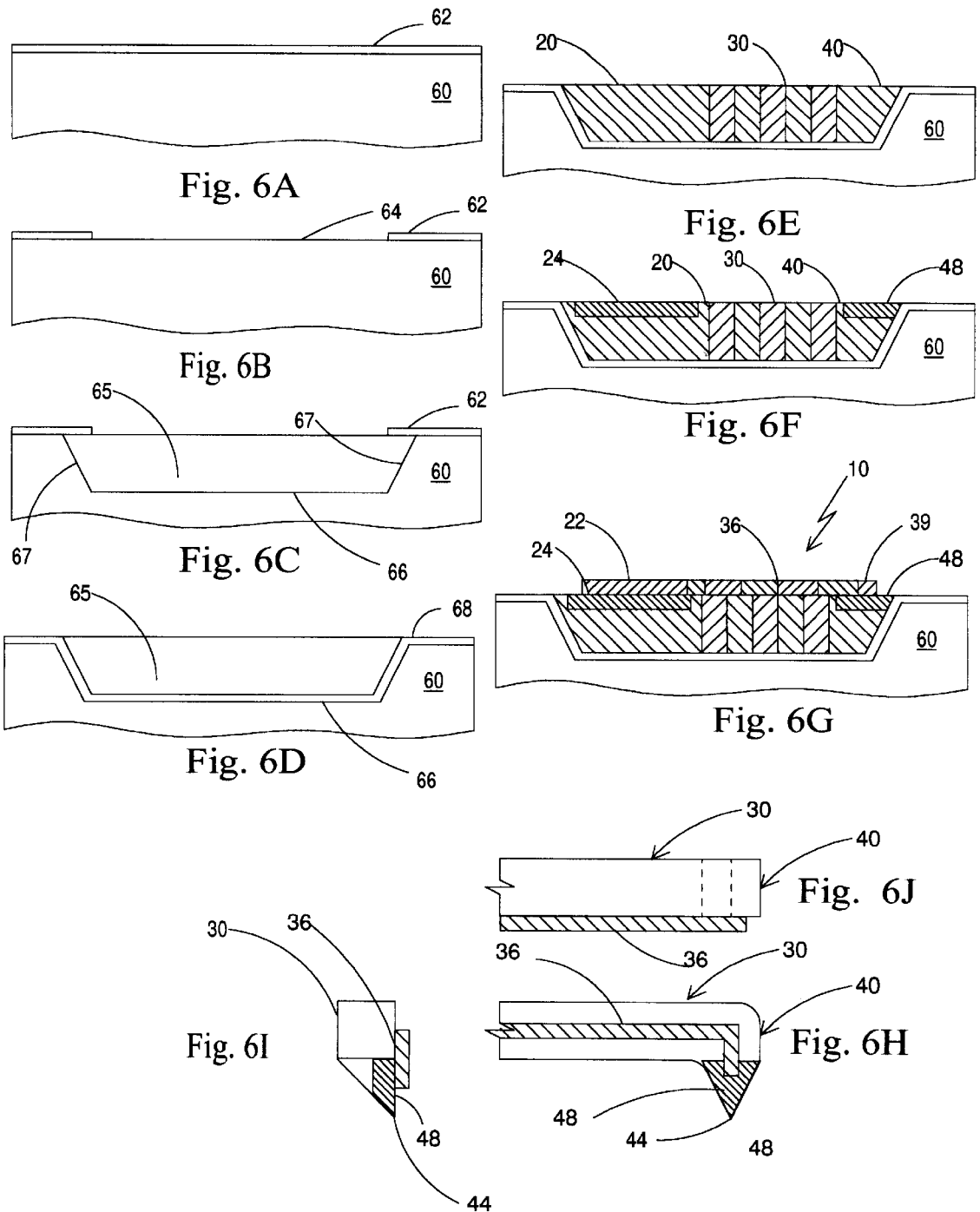

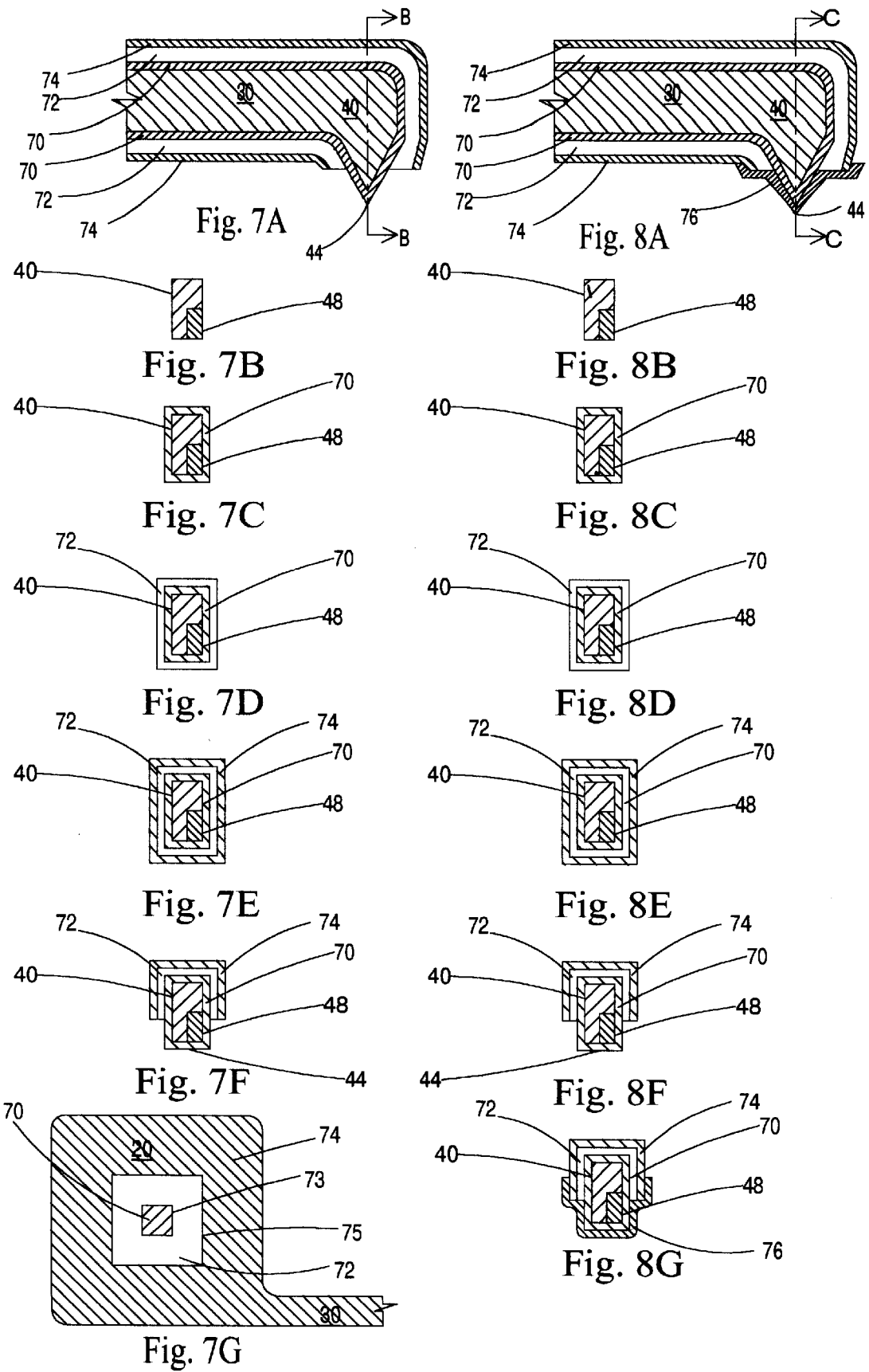

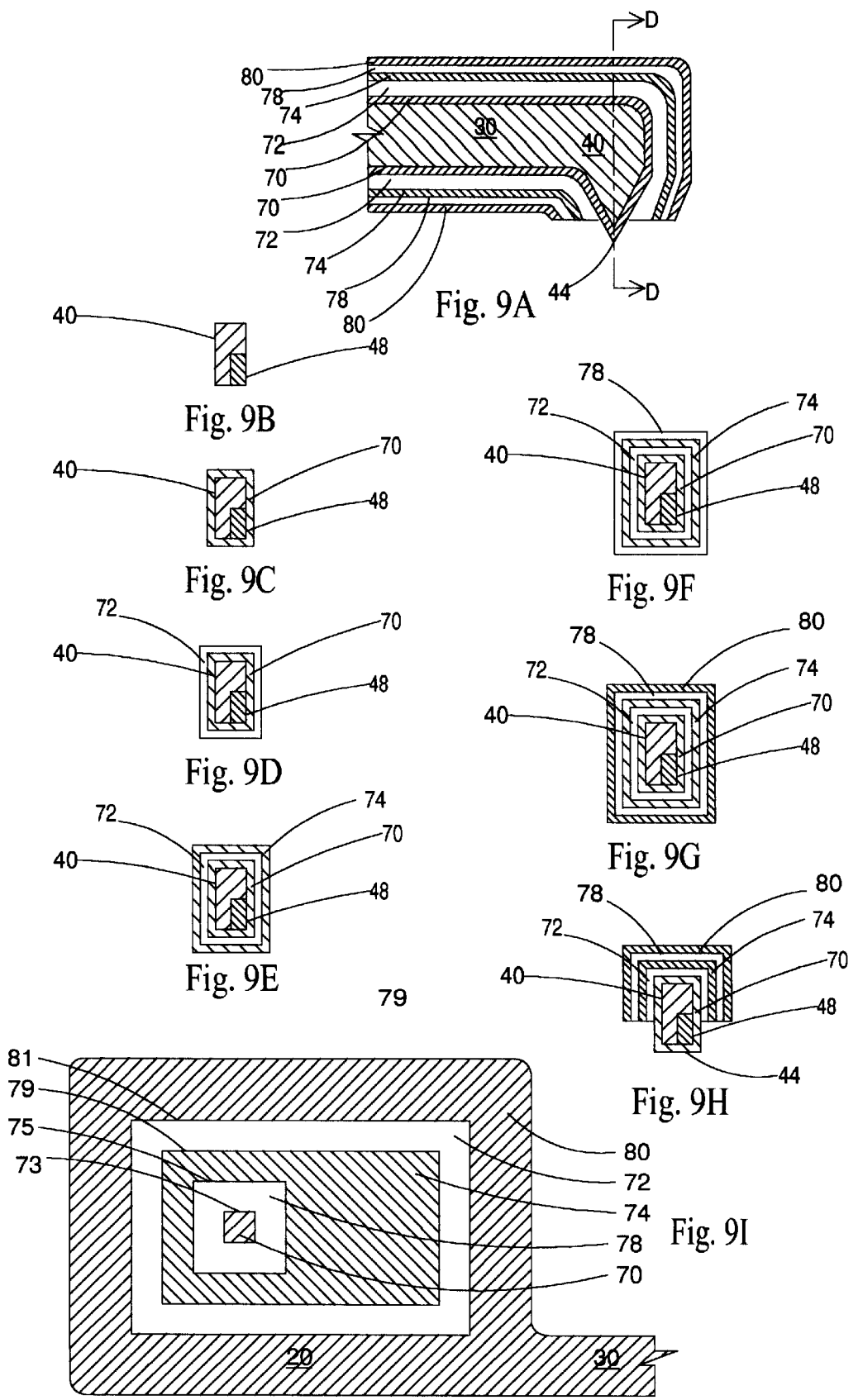

MICRO PROBE AND METHOD OF FABRICATING SAME

FIELD OF THE INVENTION

The present invention relates to an apparatus for contacting semiconductor devices and circuits to be tested and more specifically, it relates to an improved probe having an integral fine probe tip, pressure spring, conductive line, and connector for contacting said semiconductor devices and a method of constructing the improved probe.

BACKGROUND OF THE INVENTION

In the course of fabricating semiconductor devices and circuits it becomes necessary to electrically probe the devices and circuits to ascertain proper functioning and for analysis of parameters and determination of failure mechanisms. To accomplish this a finely pointed probe or group of finely pointed probes is brought into contact with the device, circuit wiring, or pads connected to the device or circuit.

A typical probe in wide use is formed by sharpening the end of a fine tungsten wire to a pointed tip. This wire is then mounted in a spring loaded manipulator. As semiconductor devices become smaller and circuits denser it becomes difficult make electrical contact with the device, circuit wiring, or pads for two reasons. Firstly, the probe tips may be too dull or blunt to make contact only to the intended the device, circuit wiring, or pads connected to the device or circuit and the device, circuit wiring, or pads. Secondly, the probe tips or wires from which they are fabricated are so thin as to bend when contact is attempted and slide off the intended contact point when sufficient pressure is placed on the probe tip to make low resistance electrical contact to the device, circuit wiring, or pads.

The present invention solves the foregoing problems by providing a finely pointed probe tip small enough to contact only the device, circuit wiring, or pads that combines both stiffness and means to prevent bending when pressure is applied.

SUMMARY OF THE INVENTION

The probe tip of the present invention has a body comprising a finely formed tip tapering to a point, a spring comprising horizontal and vertical members in the form of a serpentine and a connector for hookup to a tester. Normal semiconductor processes are used to fabricate the probe assembly, therefore the probes may be fabricated with tip dimension of a few microns and points in the sub-micron regime.

The monolithic body is formed from a materials such as polysilicon that may flex many times without breaking. Since this material may not be highly conductive, provision is made for a conductive line, typically a metal, running from the tip along the spring to the connector. Metal silicide may be applied to the tip to improve adhesion of the wiring to the monolithic body. The monolithic body is formed by either filling a trench in an oxide layer with a material such as polysilicon and after forming the metal lines and silicide, the body released by dissolving the oxide. Therefore it is an object of the present invention to provide monolithic micro probes having an integral fine probe points, pressure springs, conductive lines, and connectors for contacting semiconductor devices to be tested and a method of fabrication of such probes.

Probe tips fabricated by the method of the present invention may also be fabricated having single or double shielding layers effectively providing for coaxial and triaxial wiring up to the probe point. Several probe bodies may be formed at the same time, attached to each other in a tree. Instead of a conductive line, a first conductive layer may be deposited over the entire tree followed by alternating layers of insulator and further conductive layers, affording the capability of coaxial and triaxial protection to the signal in the main body or main body/conductive line. The tip would be selectively dip etched to remove the overlaying layers to expose the first conductive layer. Similar etching operations would be performed at the connector end. Therefore it is further object of the present invention to provide a micro probe having conductive shielding surrounding a central conductor surrounding an integral probe point, pressure spring, and connector.

After a coaxial version of the probe is fabricated, a Kelvin type probe may be fabricated by plating a conductor over the tip, electrically connecting the inner and outer conductors together at the very tip of the probe, while still maintaining its sharpness. Therefore it is still further object of the present invention to provide a micro Kelvin type probe having conductive shielding surrounding a central conductor that surrounds an integral probe point, pressure spring, and connector, wherein the inner conductor and outer shielding are electrically connected together at the probe tip.

BRIEF DESCRIPTION OF DRAWINGS

The invention as well as a preferred mode of use, further objects and advantages thereof, will best be understood by reference to the following detailed description of an illustrative embodiment when read in conjunction with the accompanying drawings, wherein:

FIG. 1A is cross-section view of the preferred embodiment of the micro probe shown in FIG. 1A;

FIG. 1B is an side view of the preferred embodiment of the micro probe according to the present invention;

FIG. 1C is side view of an alternative probe tip of the preferred embodiment of the micro probe shown in FIG. 1A;

FIG. 2 is a top view illustrating the formation of multiple monolithic probe bodies attached to a tree;

FIG. 3 is a side view of a micro probe according to the present invention, illustrating the relative scale of a portion of the probe;

FIGS. 6A through 6G are partial cross-sectional views through section AA of FIG. 1 of a method of fabrication of the micro probe according to another embodiment of the present invention;

FIG. 6H is a top view of the probe tip portion of the micro probe shown in FIGS. 6A through 6G;

FIG. 6I is a side view of the probe tip of the micro probe shown in FIG. 6H;

FIG. 6J is an end view of the probe tip of the micro probe shown in FIG. 6H;

FIG. 7A is a partial cross sectional side view of the probe tip of a coaxial embodiment of the micro probe according to the present invention;

FIGS. 7B through 7F are end views of the tip of the micro probe through section BB of FIG. 7A illustrating fabrication of a coaxial micro probe tip according to the present invention;

FIG. 7G is a top view showing connecting vias for electrical connection of the micro probe according to the coaxial embodiment to test equipment;

FIG. 8A is a partial cross sectional side view of the probe tip of a triaxial embodiment of the micro probe according to the present invention;

FIGS. 8B through 8G are end views of the tip of the micro probe through section CC of FIG. 8A illustrating fabrication of a triaxial micro probe tip according to the present invention;

FIG. 9A is a partial cross sectional side view of the probe tip of a Kelvin type probe embodiment of the micro probe according to the present invention;

FIGS. 9B through 9H are end views of the tip of the micro probe through section DD of FIG. 9A illustrating fabrication of a triaxial microprobe according to the present invention; and FIG. 9I is a top view showing connecting vias for electrical connection of the micro probe according to the triaxial embodiment to test equipment.

DETAILED DESCRIPTION OF THE INVENTION

Figure 4A:
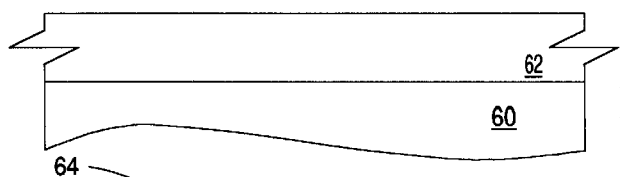
FIGS. 4A through 4F are partial cross-sectional views through section AA of FIG. 1 of a first method of fabrication of the micro probe according to the preferred embodiment of the present invention.

Attention is directed to FIG. 1A which illustrates the present invention. The micro probe comprises micro probe body 10 with a front surface 12, having a connector portion 20, a spring portion 30, and a tip portion 40, which have been formed monolithically from undoped or doped polysilicon as a preferred material. Polysilicon has been chosen because of its ability to bend with low probability of stress cracking and the ability to form metal silicides, however metal or metal alloys of Al, Cu, Ti, Ta, W, or Au could be used, Formed on connector portion 20 is conductive pad 22. Between connector 20 and conductive pad 22 is optional pad silicide layer 24, formed primarily in micro probe body 10. Spring portion 30 of micro probe body 10 comprises multiple horizontal sections 32 and multiple vertical sections 34 alternately joined to one another to form a serpentine. Although three horizontal sections are shown, it should be understood that more or fewer may be used as long as the resilting structure has the appropriate strength and resilience. Formed along horizontal sections 32 and vertical sections 34 is conductor 36. External fillets 38 have been formed at the outside corners where horizontal section 32 and vertical sections 34 meet and internal fillets 39 have been formed at the inside corners where horizontal section 32 and vertical sections 34 meet. This reduces the likelihood of stress cracking at the corners of the serpentine shaped spring portion 30. Tip portion 40 comprises sidewalls 42 tapering to tip point 44. Tip gusset 46 has been formed to strengthen the attachment of tip portion 40 to spring portion 30. Conductor 36 runs onto tip portion 40 terminating in tip conductor 39. Pad 22, conductor 36, and tip conductor 39 may be formed to be one continuous conductor and may be formed of a metal, such as, Al, Cu, Ti, Ta, Ag, Au, Pt, W, TiN, or TaN. Between tip conductor 39 and tip portion 40 is optional tip silicide layer 48, formed primarily in micro probe body 10. Pad silicide layer 24 and tip silicide layer 48 which may be contracted of PtSi or CoSi. FIG. 1B shows the relative positions of pad 22, conductor 36, and tip conductor 39. The pad silicide layer 24 and tip silicide layer 48 formed on front surface 12 of micro probe body 10 relative to rear surface 14 and edge surface 16 of micro probe body 10. The tip point 44 extends from front surface 12 to rear surface 14 on edge surface 16 but silicide layer 48 does not, in this embodiment. FIG. 1C shows tip portion 40 when the tip silicide 48 is not used and the conductor 39A is desired to extend to the edge surface 16 to become tip point 44. From FIGS. 1A through 1C, it should be clear that tip point 44 of the tip portion 40 of this embodiment is "V" shaped when viewed from the top, tip point 44 is in reality a wedge rather than a true point and that conductor 36 and connector silicide layer 24 and tip silicide layer 48 have been formed on the same and only one side of micro probe body 10. Note also that tip portion 40 extends past spring portion 30 so that spring portion 30 will not block the view of tip portion 40 during alignment to the device to be tested.

FIG. 2 illustrates the formation of multiple monolithic probe bodies 10 attached to tree 50 by sprue elements 52 attached to runner 54. Sprue elements 52 are attached to pad portion 20 of micro probe body 10. This arrangement allows separation of the micro probes from the substrate. In some of the fabrication methods to be described, the individual probes are completed in tree form and need only be broken off. In other cases the intact tree 50 is subjected to further processing before the individual probes are complete and then broken off.

FIG. 3 illustrates the relative scale between the connector 20, pressure spring 30, and probe tip 40. The thickness of tip portion 40 is a function of the size of the device to be probed and could range from 0.5 micron or less to 2 microns or more. The ratio of tip portion 40 height to depth ranges from 5:1 to 100:1 as does the ratio of spring portion 30 height to depth, which would be adjusted to change the degree of elasticity and strength. It is possible to fabricate connector portion 20 thicker than spring portion 30 and tip portion 40. In fact all three can be different thicknesses.

Figure 4B:
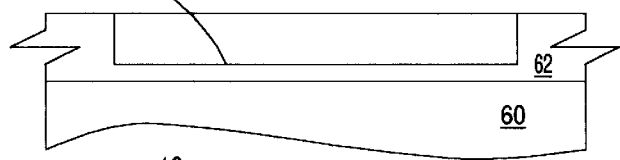
Figure 4C:
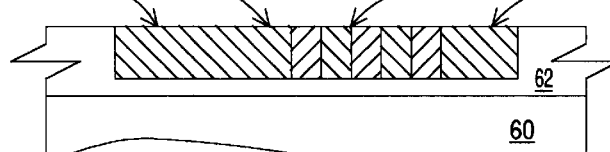
Figure 4D:
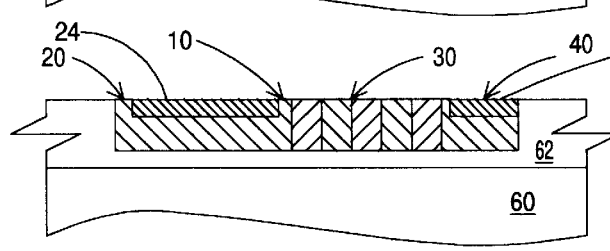
Figure 4E:
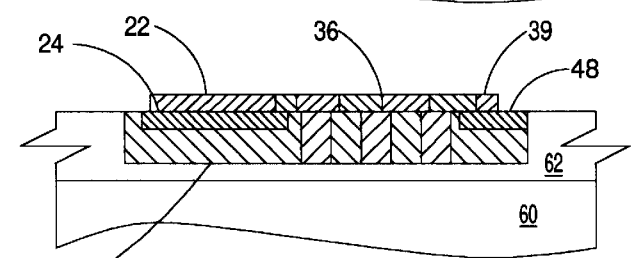
Figure 4F:
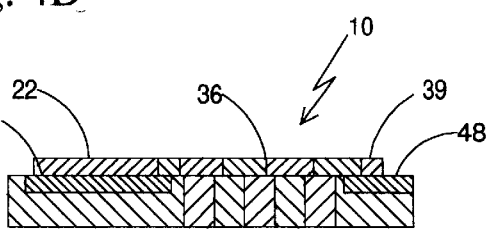
Figure 4I:
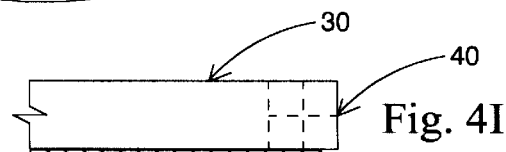
FIG. 4I is an top view of the probe tip of the micro probe shown in FIG. 4G.
Figure 4H:
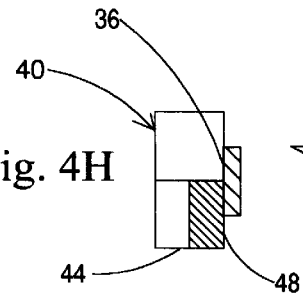
FIG. 4H is a end view of the probe tip of the micro probe shown in FIG. 4G.
Figure 4G:
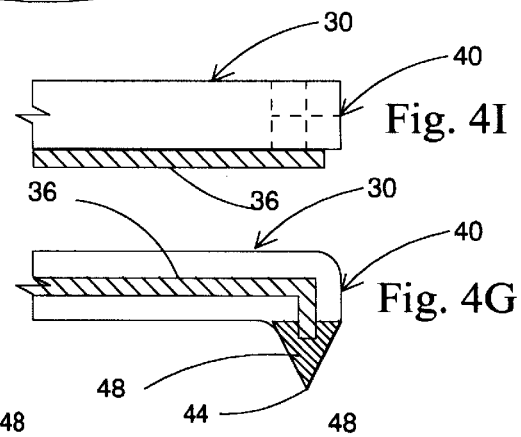
FIG. 4G is a side view of the probe tip of the micro probe according the preferred embodiment of the present invention.

Turning to methods of fabricating the preferred embodiment. FIGS. 4A through 4F are partial cross-sectional views through section AA of FIG. 1 showing a first method of fabrication of the micro probe according to the preferred embodiment of the present invention. In FIG. 4A silicon substrate 60 having $SiO_2$ layer 62 thicker than the desired width of the micro probe has been provided. In FIG. 4B trench 64 has been etched within oxide layer 62, by patterning a layer of resist and reactive ion etching (RIE) followed by stripping the resist. The pattern used is constructed in the form of a tree 50 illustrated in FIG. 2. Note by forming this pattern in steps, the depth of trench 64 could be made a first depth in the portion of the pattern corresponding to connector portion 20, a second depth in the portion of the pattern corresponding to spring portion 30, and a third depth in the portion of the pattern corresponding to tip portion 40. In FIG. 4C trench 64 has been filled with polysilicon, by chemical vapor deposition (CVD) of polysilicon followed by a chemical mechanical polish (CMP) to make the polysilicon and oxide surfaces coplanar, thus forming micro probe body 10. In FIG. 4D connector portion silicide 24 and tip silicide layer 48 have been formed in micro probe body 10 by selectively etching the polysilicon and depositing a silicide forming metal such as Pt or Co, followed by an anneal step. The position of the silicide may be controlled by selective removal of metal from areas over polysilicon where silicide is not desired prior to anneal. In FIG. 4E pad 22 and conductor 36 have been formed by evaporation and subetch or reactive ion etch. In FIG. 4F finished micro probe 10 has been released by etching away oxide layer 62 with HF or HF/NH4F aqueous based etchants. FIGS. 4G through 4I are side, end and top views of tip portion 40, which show that the point of the tip of this embodiment is a "V" shaped structure with tip point 44 being a line rather than a point, the conductor 36 and connector silicide layer 22 and tip silicide layer 48 have been formed on the side of micro probe body 10.

Figure 5A:
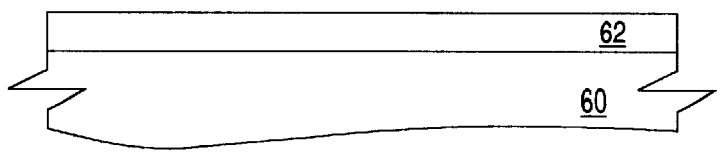
FIGS. 5A through 5F are partial cross-sectional views through section AA of FIG. 1 of a second method of fabrication of the micro probe according to the preferred embodiment of the present invention.
Figure 5B:
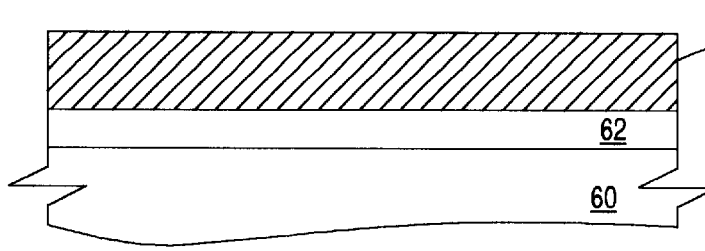
Figure 5C:
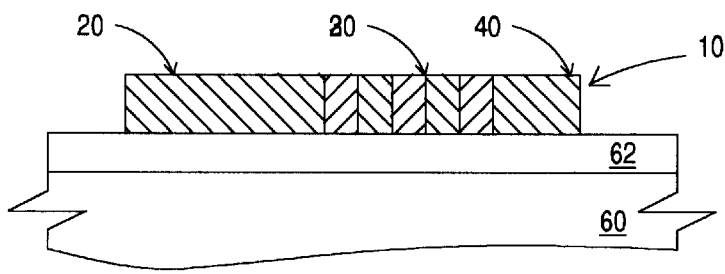
Figure 5D:
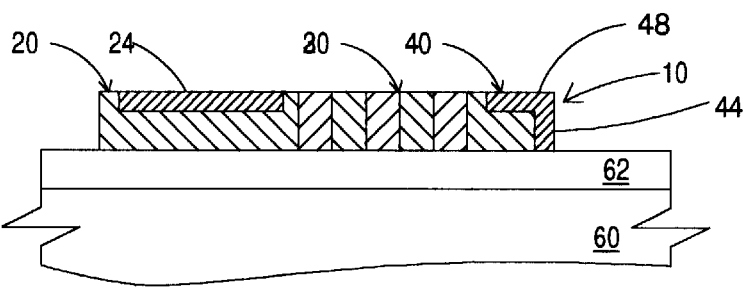
Figure 5E:
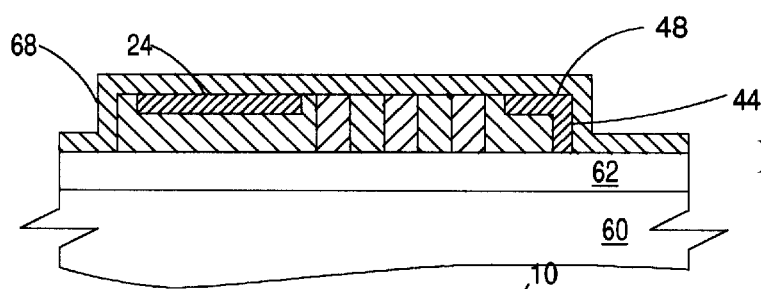
Figure 5F:
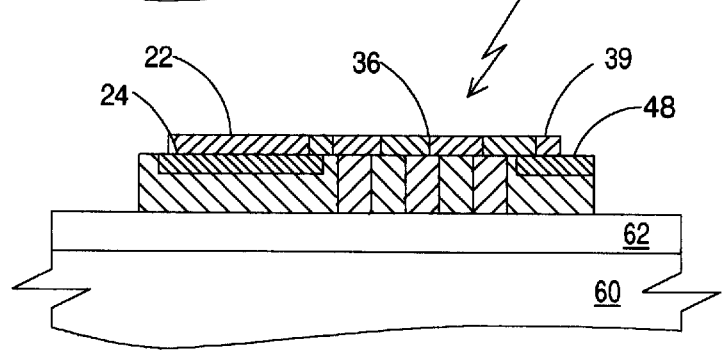

Attention is now directed to FIGS. 5A through 5F are partial cross-sectional views through section AA of FIG. 1 which show a second method of fabricating the micro probe. In FIG. 5A silicon substrate 60 having a SiO2 layer 62 has been provided. A polysilicon layer 66 is formed on top of SiO2 layer 62 by chemical vapor deposition as shown in FIG. 5B. The thickness of polysilicon layer 66 corresponds to the finished depth of micro probe body 10. In FIG. 5C polysilicon layer 66 has been etched in the form of a tree 50 as shown in FIG. 2., by patterning a layer of resist and reactive ion etching polysilicon layer 66, but not oxide layer 62, followed by stripping the resist. The connector portion silicide 24 and tip silicide layer 48 are formed into micro probe body 10 by deposition of a silicide forming metal such as Pt or Co, followed by an anneal step as shown in FIG. 5D. The position of the silicide may be controlled by selective removal of metal from areas over polysilicon where silicide is not desired prior to anneal. Note that there is silicide formation some depth in from tip point 44 as the polysilicon is exposed in this method. A blanket conductive layer is formed over the structure as shown in FIG. 5E. A pad 22 and conductor 36 are formed by evaporation and subetch or reactive ion etch as shown in FIG. 5F. The finished probe may be released by etching away oxide layer 62 with HF or HF/NH4F aqueous based etchants.

Another method of fabrication of the micro probe is shown in FIGS. 6A through 6G which are partial cross-sectional views through section AA of FIG. 1. A silicon substrate 60 having SiO2 layer 62 is used as the starting material as shown in FIG. 6A. A trench 64 is etched into the oxide layer 62, by patterning a layer of resist and reactive ion etching oxide down to the silicon substrate 60, followed by stripping the resist as illustrated in FIG. 6B. The pattern used is shaped in the form of a tree 50 illustrated in FIG. 2. The trench 65 having sloping sidewalls 67 is etched in the silicon substrate 60. For this method it is critical that the silicon substrate 60 have a crystal orientation of <100> and is etched with an an-isotropic etch. Suitable etchants include: a heated (65° C.) saturated aqueous solution of tetramethyl ammonium hydroxide, a heated saturated solution of potassium hydroxide in 80% isopropanol, a heated 30–40 wt % aqueous potassium hydroxide, or a refluxing ethylenediamine/pyrocatechol/water mixture. These mixtures etch along the <111> crystal plane much slower than along any other plane. The sidewalls of trenches etched in <100> silicon substrates will lie on the <111> crystal plane. Note by first etching the portion of the pattern corresponding to connector portion 20 in oxide layer 62 down to silicon and etching the silicon substrate ro a first pre-determined depth, followed by etching the portion of the pattern corresponding to spring portion 30 in oxide layer 62 down to silicon and etching the silicon substrate to a second pre-determined depth, followed by etching the portion of the pattern corresponding to tip portion 40 in oxide layer 62 down to silicon and etching the silicon substrate to a third pre-determined depth, three different depths of probe body in each of the three portions would be obtained. An oxide layer 68 is formed over all exposed silicon by either thermal oxidation or by deposition of silicon oxide. The trench 65 is then filled with polysilicon, by chemical vapor deposition of polysilicon followed by a chemical mechanical polish to make the polysilicon and oxide surfaces coplanar, thus forming micro probe body 10 as shown in FIG. 6D. The connector portion silicide 24 and tip silicide layer 48 are then formed in micro probe body 10 by deposition of a silicide forming metal such as Pt or Si, followed by an anneal step. The position of the silicide may be controlled by selective removal of metal from areas over polysilicon where silicide is not desired prior to anneal. The pad 22 and conductor 36 are formed by evaporation and subetch or reactive ion etch. The probe may be released by etching away oxide layer 62 with HF or HF/NH4F aqueous based etchants. FIGS. 6H through 6I show the tip portion 40 where it is clearly shown that the point of the tip of this embodiment has the shape of a three sided pyramid with tip point 44 being a true point and that conductor 36 and connector silicide layer 22 and tip silicide layer 48 have been formed on the same side of micro probe body 10.

FIGS. 7A through 7G show the steps used in fabricating a coaxial of the micro probe. FIG. 7A shows the tip region of a completed coaxial version of the micro probe. Consider that the process steps described above and illustrated in FIGS. 4A through 4C (optionally 4D), or illustrated in FIGS. 5A through 5C (optionally 5D) and, or illustrated in FIGS. 6A through 6E (optionally 6F) have been completed. Consider that the entire probe body 10 will be coated with a first conductive layer 70, followed by an insulator 72, and a second conductive layer 74. The first conductive layer 70 becomes the center conductor of the coaxial system to replace the pad 22 and the conductor 36 shown in FIG. 1. The second conductive layer 74 becomes the outer or shield conductor of the coaxial system as will now be described in conduction with FIGS. 7B through 7F. which show side views of the tip 40 through section BB of FIG. 7A. The first step is to create the tip 40 shown in FIG. 7B by one of the processes indicated above, next a first conductive layer 70 is deposited over tip 40. Suitable materials for the first conductive layer 70 include Al, Cu, Ti, Ta, Ag, Au, Pt, TiN, TaN, W. A first insulating layer 72 is then deposited over the conductive layer 70. Suitable materials for first insulating layer 72 include SiO2 or Si3N4 formed by CVD or low pressure CVD or plasma assisted CVD processes. Next a second conductive layer 74 is deposited over the first insulating layer as shown in FIG. 7E. Suitable materials for the second conductive layer 74 include Al, Cu, Ti, Ta, Ag, Au, Pt, TiN, TaN, W. A portion of the second conductive layer 74 and first insulating layer 72 are removed from the vicinity of tip point 44 by dip etching or plasma ion etching as shown in FIG. 7F. Finally a via 73 is formed in the first insulating layer 72 and via 75 is formed in conductive layer 74 to provide connection to pad 22 on connector portion 20 of micro probe body 10 for hookup to test equipment. It is desirable that the first conductive layer 70 not be removed when the second conductive layer 74 and the first insulating layer 72 are removed, so compatible materials and etchants must be selected. For example, the first conductive layer 70 could be Au or TaN, the first insulating layer 72 could be SiO2, and the second conductive layer 74 could be Al. The Al would be etched with a H3PO4/HNO3 acid mixture, and the SiO2 with HF or HF/NH4F aqueous based etchants. Other etchant/conductor combinations include NaHClO for W and H2O2/NH4OH for Cu.

Steps in fabricating a Kelvin type probe will now be described in conjunction with FIGS. 8A through 8G wherein FIG. 8A illustrates a completed Kelvin probe in the region of the spring portion 30 and tip portion 40. It should be understood that the entire probe body 10 will be coated with a first conductive layer 70, followed by an insulator 72, and second conductive layer 74. The first conductive layer 70 is intended to replace pad 22 and conductor 36 which becomes the center conductor of the Kelvin/coaxial system, and the second conductive layer 74 becomes the outer or shielding conductor of the Kelvin/coaxial system. Tip conductive layer 76 forms the Kelvin tip of the probe. Consider that the process steps described above and illustrated in FIGS. 4A through 4C (optionally 4D), or illustrated in FIGS. 5A through 5C (optionally 5D), or illustrated in FIGS. 6A through 6E (optionally 6F) have been completed. FIGS. 8B through 8F are side views of tip 40 through section CC of FIG. 8A illustrating steps in making a Kelvin/coaxial micro probe. The first step is to create the tip 40 shown in FIG. 8B by one of the processes indicated above, next a first conductive layer 70 is deposited over tip 40. Suitable materials for the first conductive layer 70 include Al, Cu, Ti, Ta, Ag, Au, Pt, TiN, TaN, W. A first insulating layer 72 is deposited over conductive layer 70. Suitable materials for first insulating layer 72 include SiO2 or Si3N4 formed by CVD or low pressure CVD or plasma assisted CVD processes. A second conductive layer 74 is deposited over the first insulating layer 72. Suitable materials for the second conductive layer 74 include Al, Cu, Ti, Ta, Ag, Au, Pt, TiN, TaN, W. A portion of the second conductive layer 74 and the first insulating layer 72 is removed by dip etching or plasma ion etching from the tip portion 40 in the vicinity of tip point 44 as shown in FIG. 8E. It is desirable that the first conductive layer 70 not be removed when the second conductive layer 74 and the first insulating layer 72 are removed, so compatible materials and etchants must be selected. It is preferred that the first conductive layer 70 not be removed when the second conductive layer 74 and the first insulating layer 72 are removed, so compatible materials and etchants must be selected. For example, the first conductive layer 70 could be Au or TaN, the first insulating layer 72 could be SiO2, and the second conductive layer 74 could be Al. The Al would be etched with a H3PO4/HNO3 acid mixture, and the SiO2 with HF or HF/NH4F aqueous based etchants. Other etchant/conductor combinations include NaHClO for W and H2O2/NH4OH for Cu. The tip point 44 is now be been plated with copper to form tip conductor 76 which connects the first conductive layer 70 to the second conductive layer 74 as shown in FIG. 8G. Other materials such as Al, Ti, Ta, Ag, Au, Pt, TiN, W can be used formed by deposition and etch.

A triaxial version of a micro probe may be fabricated using the present invention. The steps which would be used to make a triaxial probe are illustrated in FIGS. 9A through 9I. FIG. 98A illustrates a region including the end of a spring portion 30 and a tip portion 40 of a completed triaxial probe. It is understood that the entire probe body will be coated with a first conductive layer 70, followed by the insulator 72, the second conductive layer 74, the second insulating layer 78, and the third conductive layer 80. First conductive layer 70 is intended to replace pad 22 and conductor 36 which becomes the center conductor of this triaxial system, and the second conductive layer 74 becomes the middle conductor of the triaxial system. Finally the third conductive layer 80 becomes the outer or shield conductor of the triaxial system. Consider that the process steps described above and illustrated in FIGS. 4A through 4C (optionally 4D) and described above, or illustrated in FIGS. 5A through 5C (optionally 5D), or illustrated in FIGS. 6A through 6E (optionally 6F) have been completed. FIGS. 9B through 9F are side views of tip 40 through section DD of FIG. 9A illustrating steps in making a triaxial micro probe system. The first step is to create tip 40 shown in FIG. 9B by one of the processes indicated above, a first conductive layer 70 is deposited over tip 40. Suitable materials for the first conductive layer 70 include Al, Cu, Ti, Ta, Ag, Au, Pt, TiN, TaN, W. A first insulating layer 72 is deposited over the first conductive layer 70. Suitable materials for first insulating layer 72 include SiO2 or Si3N4 formed by CVD or low pressure CVD or plasma assisted CVD processes. A second conductive layer 74 is deposited over the first insulating layer 72 which becomes the outer shield of the triaxial system. Suitable materials for second conductive layer 74 include Al, Cu, Ti, Ta, Ag, Au, Pt, TiN, TaN, W. A second insulating layer 78 is deposited over the second conductive layer 74. Suitable materials for the second insulating layer 78 include SiO2 or Si3N4 formed by CVD or low pressure CVD or plasma assisted CVD processes. FIG. 9G illustrates the tip after the third conductive layer 80 has been deposited on the second insulating layer 78. Suitable materials for third conductive layer 80 include Al, Cu, Ti, Ta, Ag, Au, Pt, TiN, TaN, W. A portion of the second and third conductive layers 74 and 80 respectively, and first and second insulating layers 72 and 78 respectively, are removed in the vicinity of tip point 44 by dip etching or plasma ion etching as shown in FIG. 9H. A first via 73 is etched in the first insulating layer 72 to expose the first conducting layer 70 and a second via 75 is etched in the second conducting layer 74 to expose first via 73 and to step back the second conductive layer from first via 73 as shown in FIG. 9I. A third via 79 is etched in the second insulating layer 78 exposing first via 70 and second via 72 and a forth via 81 is etched in the third conducting layer 80 exposing first via 70, second via 73, and third via 79 and to step back the third conducting layer from third via 79. It is desirable that the first conductive layer 70 not be removed when second conductive layer 74 and first insulating layer 72 are removed from probe tip 44, so compatible materials and etchants must be selected. It is also desirable that first conductive layer 70 not be removed when the second and third conductive layers 74 and 80 and first and second insulating layers 72 and 78 are removed, so compatible materials and etchants must be selected. For example, first conductive layer 70 could be Au or TaN, first and insulating layer 72 and 78 could be SiO2, and second and third conductive layers 74 and could be Al. The Al would be etched with a H3PO4/HNO3 acid mixture, and the SiO2 with HF or HF/NH4F aqueous based etchants. Other etchant/conductor combinations include NaHClO for W and H2O2/NH4OH for Cu.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A micro probe, comprising:
    a probe body having a first major plane, a second major plane, an edge surface between the first and second major planes, and a probe tip portion, a spring portion, and a connector portion formed between said first and second major planes, wherein said probe tip portion, said spring portion, and said connector portion have a first surface coplanar with said first major plane and said probe tip portion, said spring portion, and said connector portion have a second surface coplanar with said second major plane;

said spring portion having a first and second end and comprising alternating horizontal and vertical members joined in the form of a serpentine shaped structure;

a first end of the probe tip portion connected to said first end of said spring portion, and a second end of the probe tip portion forming a probe tip point, wherein said first major plane forms a first sidewall of the probe tip point and said second major plane forms a second sidewall of the probe tip point; and said connector portion being at said second end of said spring portion.

2. The micro probe of claim 1, wherein said probe tip portion, spring portion, and said connector portion are coplanar in both front and rear major surfaces.

3. The micro probe of claim 2, wherein said side edge tapers to a point at the end of the probe tip portion.

4. The micro probe of claim 1, wherein said body is formed of polysilicon, doped polysilicon, Al, Cu, Ti, Ta, W, or Au.

5. The micro probe of claim 4, further including a first conductor formed on the front surface of said probe body, said first conductor comprising a pad on said connector portion, connected to a land on said spring portion, said land connected to a tip conductor on said probe tip.

6. The micro probe of claim 5 further comprising a silicide layer formed on at least said tip portion of said probe body under said conductor.

7. The micro probe of claim 6, wherein said conductor comprises Al, Cu, Ti, Ta, Ag, Au, Pt, W, TiN, or TaN and said silicide comprises Pt silicide or Co silicide.

8. The micro probe of claim 4, further comprising:

a first insulating layer on said first conductor, said first insulating layer having a first via over said connector portion, said via communicating with said first conductor layer, and said first insulating layer also having a first tip opening over said tip point; and a second conductor on said first insulating layer, said second conductor having a second via over said first via, and said first conductor also having a second tip opening over said first tip opening.

9. The micro probe of claim 8, wherein said first insulating layer comprises $SiO_2$ or $Si_3N_4$.

10. The micro probe of claim 9, wherein said second conducting layer comprises Al, Cu, Ti, Ta, Ag, Au, Pt, TiN, TaN, or W.

11. The micro probe of claim 10, further comprising a tip conductor electrically connecting said first and second conducting layers at said tip point.

12. The micro probe of claim 11, wherein said tip conductor comprises Al, Cu, Ti, Ta, Ag, Au, Pt, TiN, TaN, or W.

13. The micro probe of claim 8, further comprising:

a second insulating layer on said second conducting layer, said second insulating layer having a third via over said second via, said third via also communicating to said second conducting layer, and said second insulating layer also having a third tip opening over said second tip opening;

a third conductor on said second insulating layer, said third conducting layer having a forth via over said third via, and said third conducting layer also having a forth tip opening over said third tip opening.

14. The micro probe of claim 13, wherein said third conducting layer comprises Al, Cu, Ti, Ta, Ag, Au, Pt, TiN, TaN, or W and said second insulating layer comprises $SiO_2$ or $Si_3N_4$.

15. A method of fabricating a micro probe comprising the steps of:

providing a substrate having a surface;

forming a trench in the surface of said substrate, said trench having a bottom and sidewalls and being in a pattern defining in the surface of said substrate a monolithic micro probe body comprising a probe tip portion, a spring portion, and a connector portion, said spring portion having a first and second end and comprising alternating horizontal and vertical members joined in the form of a serpentine shaped structure, a first end of the probe tip portion connected to the first end of said spring portion, and a second end of the probe tip portion forming a probe tip point, and said connector portion connected at said second end of said spring portion;

filling said trench with a conductive or semiconductive material; and removing said substrate to form said monolithic probe body comprising a first major plane, a second major plane, an edge surface between the first and second major planes, and said probe tip portion, said spring portion, and said connector portion formed between said first and second major planes, wherein said probe tip portion, said spring portion, and said connector portion have a first surface coplanar with said first major plane and said probe tip portion, said spring portion, and said connector portion have a second surface coplanar with said second major plane, and further wherein said first major plane forms a first sidewall of the probe tip point and said second major plane forms a second sidewall of the probe tip point.

16. The method claim of 15, further comprising the step of forming a conductor on said probe body, said conductor comprising a pad on said terminal connector portion connected to a land on said spring portion, said land connected to a tip conductor on said probe tip portion.

17. The method of claim 16, further comprising the step of forming a silicide layer on the other end of said tip portion under said conductor.

18. The method of claim 15, wherein said sidewalls of said trench taper from the surface of said substrate to the bottom of said trench.

19. The method of claim 15, further comprising:

depositing a first conducting layer on said probe body;

depositing a first insulating layer on said first conducting layer;

etching a first via in said first insulating layer over said connector portion, said first via communicating with said first conducting layer, etching a first tip opening in said first insulating layer, over said tip end;

depositing a second conducting layer on said first insulating layer;

etching a second via in said second conducting layer over said first via; and etching a second tip opening in said second conducting layer over said first tip opening.

20. The method of claim 19, further comprising the step of:

depositing a tip conductor electrically connecting said first and second conducting layers at said tip point.

21. The method of claim 19, further comprising the steps of:

depositing a second insulating layer on said second conducting layer;

etching a third via in said second insulating layer over said second via, said second via also communicating with said second conducting layer;

etching a third tip opening over said second tip opening in said second insulating layer;

depositing a third conducting layer on said second insulating layer.

etching a forth via in said third conducting layer over third via; and etching a forth tip opening over said third tip opening in said third conducting layer.

22. A method of fabricating a micro probe comprising the steps of:

providing a substrate having a surface;

depositing a polysilicon layer;

etching said polysilicon layer in a pattern defining a monolithic micro probe body comprising a probe tip portion, a spring portion, and a connector portion, said spring portion having first and second end regions and comprising alternating horizontal and vertical members joined in the form of a serpentine shaped structure, said probe tip portion being at a first end of said spring portion, and tapering to a tip point, and said connector portion being at said second end region of said spring portion; and removing said substrate to form said monolithic probe body comprising a first major plane, a second major plane, an edge surface between the first and second major planes, and said probe tip portion, said spring portion, and said connector portion formed between said first and second major planes, wherein said probe tip portion, said spring portion, and said connector portion have a first surface coplanar with said first major plane and said probe tip portion, said spring portion, and said connector portion have a second surface coplanar with said second major plane, and further wherein said first major plane forms a first sidewall of the probe tip point and said second major plane forms a second sidewall of the probe tip point.

* * * * *